United States Patent
Lo et al.

(10) Patent No.: US 6,885,093 B2
(45) Date of Patent: Apr. 26, 2005

(54) STACKED DIE SEMICONDUCTOR DEVICE

(75) Inventors: Wai Yew Lo, Petaling Jaya (MY);
Azhar Bin Aripin, Selangor (MY);
Kong Bee Tiu, Port Klang (MY)

(73) Assignee: Freescale Semiconductor, Inc., Austin, TX (US)

( * ) Notice: Subject to any disclaimer, the term of this patent is extended or adjusted under 35 U.S.C. 154(b) by 28 days.

(21) Appl. No.: 10/085,869

(22) Filed: Feb. 28, 2002

(65) Prior Publication Data

US 2003/0160312 A1 Aug. 28, 2003

(51) Int. Cl.$^7$ .............................................. H01L 23/02
(52) U.S. Cl. ..................................... 257/686; 257/777
(58) Field of Search ................................ 257/686, 777, 257/723

(56) References Cited

U.S. PATENT DOCUMENTS

| | | | |
|---|---|---|---|
| 5,323,060 A | | 6/1994 | Fogal et al. |
| 6,034,429 A | | 3/2000 | Glenn |
| 6,333,562 B1 | | 12/2001 | Lin |
| 6,530,515 B1 | * | 3/2003 | Glenn et al. ................. 228/214 |
| 6,593,662 B1 | | 7/2003 | Pu et al. |
| 2002/0105792 A1 | * | 8/2002 | Beroz et al. ................. 361/811 |
| 2002/0195624 A1 | * | 12/2002 | Glenn et al. ................. 257/200 |
| 2003/0038357 A1 | * | 2/2003 | Derderian ................... 257/686 |
| 2003/0042615 A1 | * | 3/2003 | Jiang et al. ................. 257/777 |
| 2003/0057538 A1 | * | 3/2003 | Watson ....................... 257/686 |

OTHER PUBLICATIONS

Amkor Technology, 3D Technology Stacked CSP, Presentation Materials, Dec. 2000.
PCT/US03/03761International Search Report.
Abstract of Taiwan Patent 445,610 published Jul. 7, 2001.

* cited by examiner

*Primary Examiner*—Phat X. Cao
(74) *Attorney, Agent, or Firm*—Charles E. Bergere; Michael P. Noonan; Robert L. King

(57) ABSTRACT

A stacked multichip package (100) has a base carrier (102) having a top side (108) and a bottom side (110), a bottom integrated circuit die (104) having a bottom surface (112) attached to the base carrier top side (108), and an opposing, top surface (114). The top surface (114) has a peripheral area including a plurality of first bonding pads and a central area (120). A bead (124) is formed on the top surface (114) of the bottom die (104) between the peripheral area and the central area (120). A top integrated circuit die (106) having a bottom surface is positioned over the bottom die (104) and the bottom surface of the top die (106) is attached to the top surface (114) of the bottom die (104) via the bead (124). The bead (124) maintains a predetermined spacing between the bottom die (104) and the top die (106) so that wirebonds of first wires (122) connecting the bottom die (104) to the base carrier (102) are not damaged when the top die (106) is attached to the bottom die (104).

14 Claims, 2 Drawing Sheets

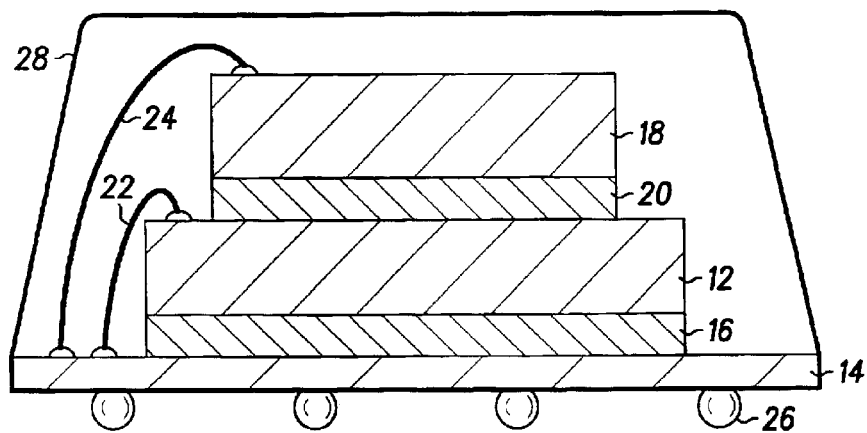
FIG. 1 - PRIOR ART -
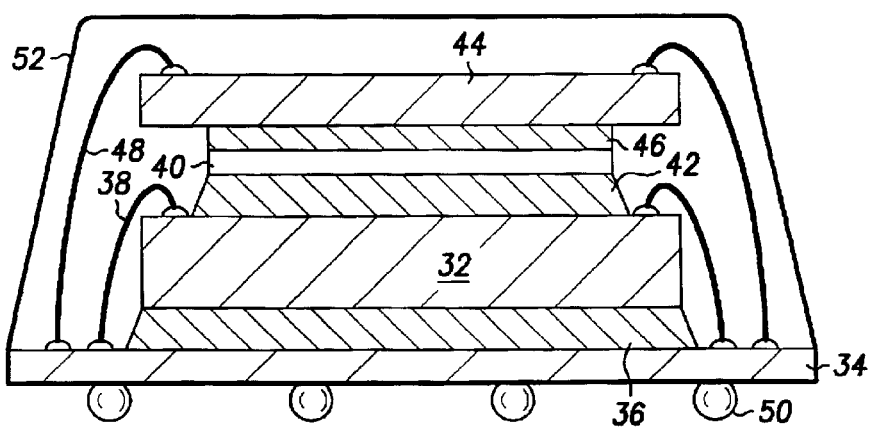
FIG. 2 - PRIOR ART -
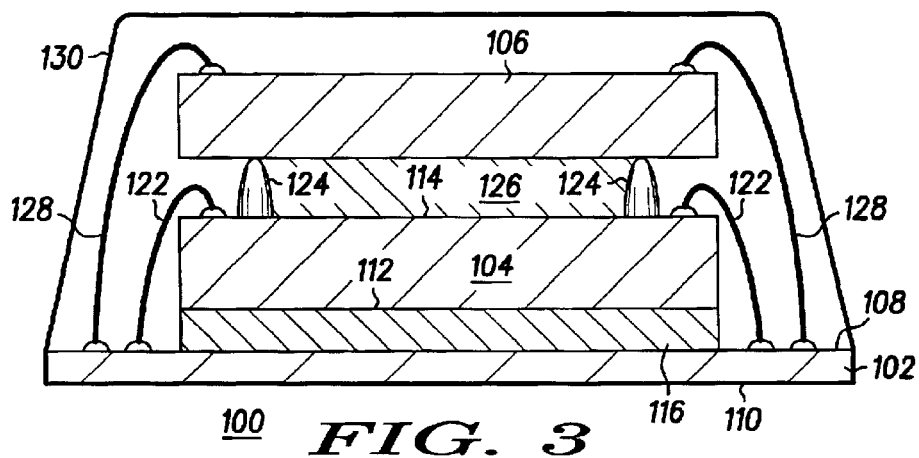
FIG. 3

STACKED DIE SEMICONDUCTOR DEVICE

BACKGROUND OF THE INVENTION

The present invention relates to integrated circuits and a method of packaging integrated circuits and, more particularly, to stacked multi-chip package type integrated circuits.

An integrated circuit (IC) die is a small device formed on a semiconductor wafer, such as a silicon wafer. Such a die is typically cut from the wafer and attached to a base carrier for interconnect redistribution. Bond pads on the die are then electrically connected to the leads on the carrier via wire bonding. The die and wire bonds are encapsulated with a protective material such that a package is formed. The leads encapsulated in the package are redistributed in a network of conductors within the carrier and end in an array of terminal points outside the package. Depending on the package types, these terminal points may be used as-is, such as in TSOP, or further processed, such as attaching spherical solder balls for a Ball Grid Array (BGA). The terminal points allow the die to be electrically connected with other circuits, such as on a printed circuit board. In subsequent examples, a MAPBGA is used to illustrate the invention disclosed herein.

With the goal of increasing the amount of circuitry in a package, but without increasing the area of the package so that the package does not take up any more space on the circuit board, manufacturers have been stacking two or more die within a single package. Such devices are sometimes referred to as stacked multichip packages. FIG. 1 shows a first conventional stacked multichip package 10. The package 10 includes a first or bottom die 12 attached to a base carrier 14 (in this example, a MAPBGA substrate) with a first adhesive layer 16. A second or top die 18 is attached to the bottom die 12 with a second adhesive layer 20 similar to the first adhesive layer 16. The bottom and top dice 12, 18 are electrically connected to the base carrier 14 with wires 22 and 24, respectively, via wirebonding. Terminals 26, in this case spherical solder ball terminals, are connected to a network or redistribution layer (not shown) of the base carrier 14. The bottom and top dice 12, 18 and the wires 22, 24 are sealed with a resin 28, thus forming the stacked multichip package 10. In order to allow the bottom die 12 to be wirebonded to the leads of the base carrier 14, the top die 18 must be smaller than the bottom die 12.

FIG. 2 shows a second conventional stacked multichip package 30. The second package 30 includes a first or bottom die 32 attached to a base carrier or substrate 34 with a first adhesive layer 36. Bond pads on the bottom die 32 are electrically connected to leads on the substrate 34 with first wires 38 via wirebonding. A spacer 40, typically made of bare silicon, is attached to the bottom die 32 with a second adhesive layer 42. A third or top die 44 is attached to the spacer 40 with a third adhesive layer 46.

The top die 44 is almost the same size or bigger than the bottom die 32. In such a situation, wirebonding of the bottom die 32 is impossible if the top and bottom dice 32, 44 are attached as shown in FIG. 1 (i.e., without the spacer 40). However, as shown in the drawing, the spacer 40 is smaller than the bottom die 32 so that the bottom die 32 may be wirebonded without obstruction. Thus, bond pads on the top die 44 are electrically connected to the substrate 34 with second wires 48 via wirebonding.

The total thickness of the spacer 40 and the second and third adhesive layers 42 and 46 must also be large enough so that the wires 38 connected to the bottom die 32 are not disturbed when the top die 44 is attached to the spacer 40. Spherical solder ball terminals 50 are connected to a wiring layer (not shown) of the substrate 34. The bottom die 32, top die 44, spacer 40 and the wires 38, 48 are sealed with a resin 52, thus forming the stacked multichip package 30. While this solution allows two die with almost the same size to be packaged together, the spacer 40 increases the process lead time, cost and size (height) of the package 30.

It would be desirable to be able to stack two or more die of the same size, or an even larger top die in a single package without unduly increasing the size of the resulting package and without the requirement of a spacer.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings:

FIG. 1 is an enlarged side view of a first conventional stacked multichip package;

FIG. 2 is an enlarged side view of a second conventional stacked multichip package;

FIG. 3 is an enlarged side view of a stacked multichip package in accordance with a first embodiment of the invention;

DETAILED DESCRIPTION OF PREFERRED EMBODIMENTS

Figure 4:
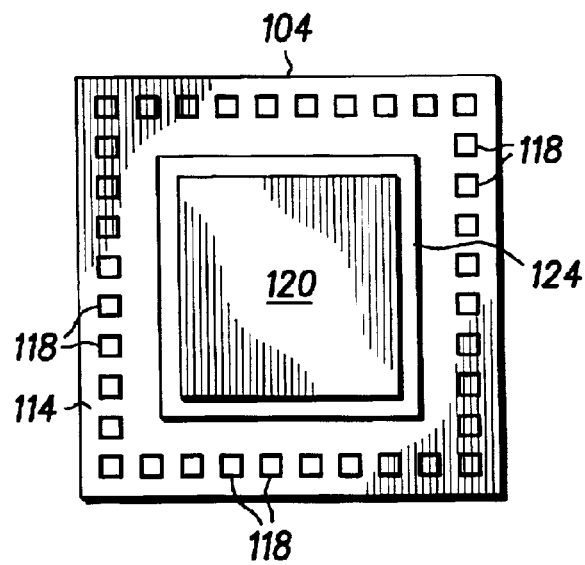
FIG. 4 is an enlarged top plan view of a bottom die and a bead of the stacked multichip package of FIG. 3.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention. For simplicity, examples used to illustrate the invention refer only to a package having two stacked dice. However, the same invention in fact can be applied to packages having more than two stacked dice.

Certain features in the drawings have been enlarged for ease of illustration and the drawings and the elements thereof are not necessarily in proper proportion. However, those of ordinary skill in the art will readily understand such details. In the drawings, like numerals are used to indicate like elements throughout.

In order to provide a stacked multichip package in which a top die is about the same size or larger than a bottom die, the present invention is A stacked multichip package, including a base carrier, a bottom integrated circuit die, and a top integrated circuit die. The base carrier has a top side and a bottom side. The bottom surface of the bottom die is attached to the base carrier top side. The top surface of the bottom die has a peripheral area including a plurality of first bonding pads and a central area. An adhesive material bead is formed on the top surface of the bottom die between the peripheral area and the central area. The top die is positioned over the bottom die and the bottom surface of the top die is attached to the top surface of the bottom die via the bead. The bead maintains a predetermined spacing between the bottom die and the top die.

The present invention also provides a stacked multichip package including a base carrier, a bottom integrated circuit die, a top integrated circuit die, an adhesive material bead, and an encapsulant. The base carrier has a top side and a bottom side, the top side including a plurality of first leads and a plurality of second leads. The bottom die has a bottom surface attached to the base carrier top side, and an opposing, top surface. The top surface of the bottom die has a peripheral area including a plurality of first bonding pads and a central area. The bottom die is electrically connected to the base carrier with first wires. The first wires have first ends electrically connected to the first bonding pads and second ends electrically connected to the first leads. The bead is formed on the top surface of the bottom die between the peripheral area and the central area. An adhesive material is formed in the central area on the top surface of the bottom die, and is surrounded by the bead. The top die has a bottom surface and a top surface. The top die is positioned over the bottom die and the bottom surface of the top die is attached to the top surface of the bottom die via the bead and the adhesive material. The bead maintains a predetermined spacing between the bottom die and the top die. The top die includes a plurality of second bonding pads located in a peripheral area on a top surface thereof and the top die is electrically connected to the base carrier with second wires. The second wires have first ends electrically connected to the second bonding pads and second ends electrically connected to the second leads. The encapsulant covers the first and second dice, the first and second wires, and at least a portion of the top side of the base carrier.

The present invention also provides a method of making a stacked multichip package including the steps of:

attaching a bottom integrated circuit die to a base carrier, the bottom die having a top surface and a bottom surface, wherein the bottom surface is attached to a top side of the base carrier and wherein the bottom die top surface has a central area and a peripheral area, the peripheral area including a plurality of first bonding pads;

electrically connecting the bottom die to the base carrier by wirebonding first wires to the plurality of first bonding pads of the bottom die and to corresponding first leads on the top side of the base carrier;

forming a bead of adhesive material between the central area and the peripheral area on the top surface of the bottom die, wherein the bead has a predetermined height;

attaching a bottom surface of a top die to the top surface of the bottom die with the adhesive material bead, wherein the bead causes the top die to be spaced from the bottom die such that the top die does not contact the first wires; and electrically connecting the top die to the base carrier by wirebonding second wires to second bonding pads located on a top surface of the top die and to corresponding second leads on the base carrier.

The present invention also provides a method of making a stacked multichip package comprising the steps of:

attaching a bottom integrated circuit die to a base carrier, the bottom die having a top surface and a bottom surface, wherein the bottom surface is attached to a top side of the base carrier and wherein the bottom die top surface has a central area and a peripheral area, the peripheral area including a plurality of first bonding pads;

electrically connecting the bottom die to the base carrier by wirebonding first wires to the plurality of first bonding pads of the bottom die and to corresponding first leads on the top side of the base carrier;

forming a bead of adhesive material between the central area and the peripheral area on the top surface of the bottom die, wherein the bead has a predetermined height;

filling the central area on the top surface of the bottom die with an adhesive material, wherein the adhesive material is surrounded by the bead;

attaching a bottom surface of a top die to the top surface of the bottom die, wherein the bead and the adhesive material secure the top die to the bottom die and wherein the bead causes the top die to be spaced from the bottom die such that the top die does not contact the first wires;

electrically connecting the top die to the base carrier by wirebonding second wires to second bonding pads located on a top surface of the top die and to corresponding second leads on the base carrier; and encapsulating the top and bottom dice, the first and second wires, and at least a portion of the base carrier with a resin.

Referring now to FIG. 3, an enlarged side view of a stacked multichip package 100 in accordance with the present invention is shown. The stacked multichip package 100 includes a base carrier or substrate 102, a bottom integrated circuit die 104 and a top integrated circuit die 106. The substrate 102, the bottom die 104, and top die 106 are of a type well known to those of ordinary skill in the art.

The bottom die 104 and the top die 106 preferably have substantially the same length and width dimensions. However, the top die 106 may be somewhat larger or somewhat smaller than the bottom die 104. For example, typical bottom and top die sizes may range from 4 mm×4 mm to 12 mm×12 mm. The bottom and top dice 104, 106 may also have the same thickness, however, this is not required. Depending on the required final package outline thickness, the bottom and top die 104, 106 may have a thickness ranging from about 6 mils to about 21 mils.

The substrate 102 has a top side 108 and a bottom side 110. The bottom die 104 has a bottom surface 112 and a second, opposing top surface 114. The bottom surface 112 of the bottom die 104 is attached to the top side 108 of the substrate 102. Preferably, the bottom die 104 is attached to the substrate 102 with a first adhesive material layer 116. The first adhesive material layer 116 may be any suitable adhesive material, such as an adhesive tape, a thermo-plastic adhesive, an epoxy material, or the like. Suitable adhesives for attaching an integrated circuit die to a substrate are well known to those of skill in the art.

As shown in FIG. 4, the top surface 114 of the bottom die 104 has a peripheral area including a plurality of first bonding pads 118 and a central area 120. Referring again to FIG. 3, the bottom die 104 is electrically connected to leads (not shown) on the substrate 102 with first wires 122. More particularly, one end of the first wires 122 is electrically connected to the bonding pads 118 on the top surface 114 of the bottom die 104, and opposing ends of the first wires 122 are wirebonded to the leads located on the top surface 108 of the substrate 102. Suitable bond wires typically comprise a conductive metal such as copper or gold.

Referring now to FIG. 3 and FIG. 4, a bead 124 is formed on the top surface 114 of the bottom die 104 between the peripheral area and the central area 120. The bead 124 is sized to provide adequate spacing between the bottom die 104 and the top die 106 when the top die 106 is attached to the bottom die 104, as shown in FIG. 3, such that when the top die 106 is attached to the bottom die 104, the wirebonds of the first wires 122 are not damaged. For example, the bead 124 may have a height of about 100 microns. The bead 124 preferably comprises an adhesive material that is hardenable such as epoxy so that the bead 124 maintains the top die 106 a predetermined distance from the bottom die 104 and the wirebonds, yet also secures the top die 106 to the bottom die 104. However, the bead 124 could be formed of other materials, such as silicone or blends of materials. In the drawings, the bead 124 is generally square shaped. However, the bead 124 may have other shapes, such as circular, oval, rectangular, or the like. The bead 124 may be formed on the bottom die 104 with a needle and syringe or an epoxy dam writer, as are known by those of skill in the art. The height and width of the bead 124 may be varied depending on the size of the needle through which the epoxy or bead material is dispensed onto the bottom die 104.

In a preferred embodiment, an adhesive material 126 is formed in the central area 120 on the top surface 114 of the bottom die 104, with the adhesive material 126 being surrounded by the bead 124. The top die 106 is attached to the bottom die 104 with the bead 124 and the adhesive material 126. More particularly, a bottom surface of the top die 106 is attached to the central area 120 of the top surface 114 of the bottom die 104 via the bead 124 and the adhesive material 126. As previously discussed, the bead 124 is sized and shaped to maintain a predetermined spacing between the bottom die 104 and the top die 106 so that the wirebonds of the first wires 122 are not damaged when the top die 106 is attached to the bottom die 104.

The adhesive material 126 may be comprised of the same type of materials as the bead 124. For example, in the presently preferred embodiment, the bead 124 comprises an epoxy having a first viscosity and the adhesive material 126 comprises an epoxy having a second, lower viscosity. For example, the bead 124 typically has a viscosity ranging from 600 Kps to 1300 Kps whereas the adhesive material 126 has a viscosity ranging from 0.15 Kps to 100 Kps. However, as will be understood by those of skill in the art, the viscosity of the adhesive material 126 depends very much on the density and size of the material used.

The top die 106 includes a plurality of second bonding pads (not shown) located in a peripheral area on a top surface thereof. The top die 106 is electrically connected to the base carrier 102 with second wires 128. The second wires 128 have first ends electrically connected to the second bonding pads and second ends electrically connected to second leads (not shown) on the base carrier 102. The second wires 128 are preferably wirebonded to the second bonding pads and the second leads.

An encapsulant 130 such as resin covers the first and second dice 104, 106, the first and second wires 122, 128 and at least a portion of the top side of the base carrier 102.

Figure 5:
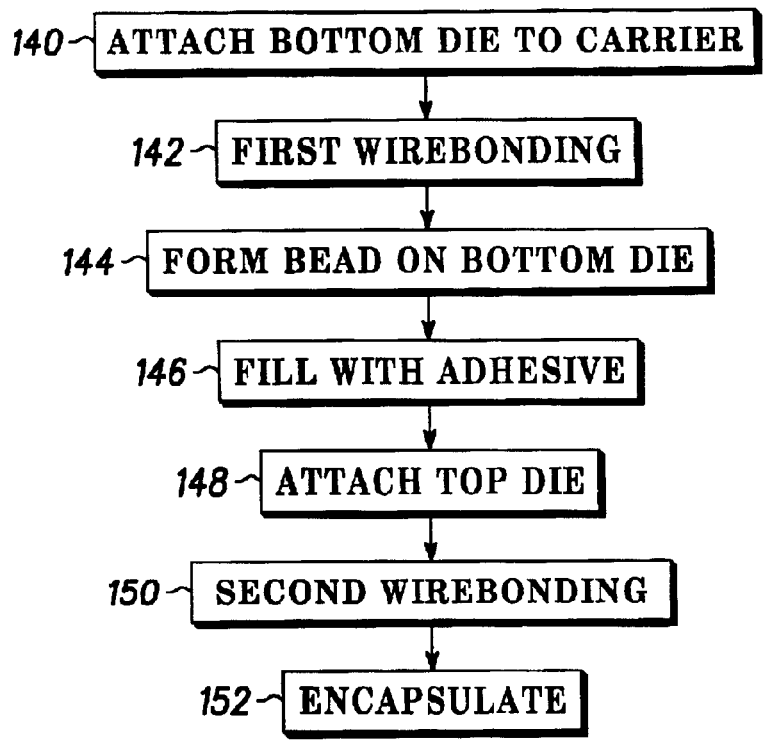
FIG. 5 is a flowchart illustrating the steps for forming the stacked multichip package of FIG. 3.

Referring now to FIG. 5, a method of making a stacked multichip package in accordance with the present invention is shown. In a first step 140, a first or bottom die, such as the bottom die 104 is attached to a base carrier, such as the base carrier 102. As previously discussed, the bottom die 104 can be attached to the substrate 102 in a known manner, such as with an adhesive tape or an epoxy. More particularly, a first or bottom surface of the bottom die 104 is attached to a top surface of the base carrier 102.

After the bottom die 104 is attached to the base carrier 102, the bottom die 104 is electrically connected to the base carrier 102 via wirebonding, in a first wirebonding step 142. As is well known, the top surface of the bottom die 104 has a plurality of bonding pads spaced along its periphery. First bonding wires 122 are wirebonded to this plurality of bonding pads and to a corresponding plurality of leads on the base carrier 102.

Prior to attaching the top die 106 to the bottom die 104, in a step 144 the bead 124 is formed between the bottom die bonding pads and a central area of the top surface 114 of the bottom die 104, as shown in FIG. 4. The bead 124 preferably comprises a high viscosity epoxy. The epoxy can be dispensed on to the top surface 114 with a needle. The viscosity of the bead material is controlled so that when the bead is formed, the material does not flow onto the peripheral area of the bottom die where it would interfere with the wirebonds or the wirebonding process. That is, if the first wirebonding step 142 is performed before the bead forming step 144, then the bead material has a viscosity such that when the bead 124 is formed, the material does not flow onto the wirebonds. Alternatively, if the bead 124 is formed before the wirebonding step 142, then the bead material must not flow onto the bonding pads. If the bead material viscosity is not high enough and the material flows onto the first bonding pads, the first bonding pads must be cleaned before the first wirebonding step 142 can be performed. The bead 124 is formed to have a predetermined height so that when the top die 106 is later attached to the bottom die 104, such as by press fitting, the top die 106 is not pressed into the wirebonds. That is, the bead 124 maintains a predetermined spacing between the bottom die 104 and the top die 106. For example, for a die size of 4.5 mm×4.5 mm×11 mils, the bead 124 may have a height of about 100 microns and a width of about 0.3 mm.

In step 146, an adhesive or adhesive material 126 is placed on a central area of the top surface 114 of the bottom die 104 so that the top die 106 can be attached to the bottom die 104. The bead 124 forms a dam into which the additional adhesive material 126 is dispensed. Although not its main purpose, the bead 124 or dam can prevent the additional adhesive material 126 from flowing onto the wirebonds and first bonding pads. Preferably the additional adhesive material 126 comprises a low viscosity epoxy. The additional adhesive material 126 can be applied to the central area with a dispensing needle in a known manner. For example, the bead 124 may be formed with epoxy and allowed to begin to harden, such as by waiting a predetermined time, by heating, or by applying ultraviolet light, prior to dispensing the additional adhesive material 126.

In step 148, a bottom surface of the top die 106 is attached to the bottom die 104 using the bead 124 and the additional adhesive material 126 to secure the top die 106 to the bottom die 104. That is, the top die 106 is secured to the bottom die 104 preferably before the bead material 124 has hardened to a point beyond which it is an effective adhesive. In addition to aid in securing the top die 106 to the bottom die 104, the bead 124 causes the top die 106 to be spaced from the bottom die 104 such that the top die 106 does not contact the first wires 122.

The top die 106 preferably has generally the same or larger dimensions as the bottom die 104. That is, the bottom and top dice 104, 106 have substantially the same length and width or the top die 106 may have a larger length and/or width than the bottom die 104. For example, typical bottom and top die sizes may range from 4 mm×4 mm to 12 mm×12 mm. The bottom and top dice 104, 106 may also have the same thickness, however, this is not required. Depending on the required final package outline thickness, the bottom and top die may have a thickness ranging from about 6 mils to about 21 mils.

The top die 106 can then be electrically connected to the substrate 102 via wirebonding in a second wirebonding step 150. The second wires 128 are wirebonded to the bonding pads of the top die 106 and corresponding leads (not shown) on the base carrier 102.

Finally, in step 152, the bottom and top dice 104, 106, the first and second wires 122, 128, and at least a portion of the base carrier 102 are covered with an encapsulant. The resulting stacked multichip package has two, almost same-sized stacked die, yet the overall package height is less than the package height of the prior art stacked die package that includes a dummy, spacer die. The cost of the stacked multichip package is also reduced because a dummy die is not required and the step of attaching the dummy die is not required.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, the present invention is not limited to a package with two stacked dice, but can be applied to a package with multiple stacked dice. Further, the present invention is not limited to any single wire bonding technique or to a particular package. That is, the invention is applicable to all wire bonded package types, including but not limited to BGA, QFN, QFP, PLCC, CUEBGA, TBGA, and TSOP. In addition, the die sizes and the dimensions of the steps may vary to accommodate the required package design. It is understood, therefore, that this invention is not limited to the particular embodiments disclosed, but covers modifications within the spirit and scope of the present invention as defined by the appended claims.

What is claimed is:

1. A stacked multichip package, comprising:
   a base carrier having a top side and a bottom side;
   a bottom integrated circuit die having a bottom surface attached to the base carrier top side, and an opposing, top surface, the top surface having a peripheral area including a plurality of first bonding pads and a central area;
   a bead formed on the top surface of the bottom die between the peripheral area and the central area, wherein the bead does not extend to the first bonding pads;
   an adhesive material formed in the central area on the top surface of the bottom die, the adhesive material being surrounded by the bead; and
   a top integrated circuit die having a bottom surface, wherein the top die is positioned over the bottom die and the bottom surface of the top die is attached to the top surf ace of the bottom die via the adhesive material, wherein the bead maintains a predetermined spacing between the bottom die and the top die and wherein the top die and the bottom die are of similar size and shape as the bottom die.

2. The stacked multichip package of claim 1, wherein the bottom die is attached to the base carrier with a first adhesive material layer.

3. The stacked multichip package of claim 1, wherein the bead comprises epoxy.

4. The stacked multichip package of claim 1, wherein the adhesive material comprises epoxy.

5. The stacked multichip package of claim 1, wherein the bottom die is electrically connected to the base carrier with first wires, the first wires having first ends electrically connected to the first bonding pads and second ends electrically connected to first leads on the top side of the base carrier.

6. The stacked multichip package of claim 5, wherein the top die includes a plurality of second bonding pads located in a peripheral area on a top surface of the top die and wherein the top die is electrically connected to the base carrier with second wires, the second wires having first ends electrically connected to the second bonding pads and second ends electrically connected to second leads on the top side of the base carrier.

7. The stacked multichip package of claim 6, further comprising an encapsulant covering the first and second dies, the first and second wires, and at least a portion of the top side of the base carrier.

8. A stacked multichip package, comprising:
   a base carrier having a top side and a bottom side;
   a bottom integrated circuit die having a bottom surface attached to the base carrier top side, and an opposing, top surface, the top surface having a peripheral area including a plurality of first bonding pads and a central area;
   a bead formed on the top surface of the bottom die between the peripheral area and the central area, wherein the bead does not extend to the first bonding pads;
   an adhesive material formed in the central area on the top surface of the bottom die, the adhesive material being surrounded by the bead; and
   a top integrated circuit die having a bottom surface, wherein the top die is positioned over the bottom die and the bottom surface of the top die is attached to the top surface of the bottom die via the adhesive material, wherein the bead maintains a predetermined spacing between the bottom die and the top die and wherein the top die is larger than the bottom die.

9. A stacked multichip package, comprising:
   a base carrier having a top side and a bottom side, the top side including a plurality of first leads and a plurality of second leads;
   a bottom integrated circuit die having a bottom surface attached to the base carrier top side, and an opposing, top surface, the top surface having a peripheral area including a plurality of first bonding pads and a central area, wherein the bottom die is electrically connected to the base carrier with first wires, the first wires having first ends electrically connected to the first bonding pads and second ends electrically connected to the first leads;
   a bead formed on the top surface of the bottom die between the peripheral area and the central area, wherein the bead does not extend to the first bonding pads;
   an adhesive material formed in the central area on the top surface of the bottom die, the adhesive material being surrounded by the bead;
   a top integrated circuit die of similar size and shape as the bottom die, the top die having a bottom surface, wherein the top die is positioned over the bottom die and the bottom surface of the top die is attached to the top surface of the bottom die via the bead and the adhesive material, and the bead maintains a predetermined spacing between the bottom die and the top die, and wherein the top die includes a plurality of second bonding pads located in a peripheral area on a top surface thereof and wherein the top die is electrically connected to the base carrier with second wires, the second wires having first ends electrically connected to the second bonding pads and second ends electrically connected to the second leads; and an encapsulant covering the first and second dies, the first and second wires, and at least a portion of the top side of the base carrier.

10. The stacked multichip package of claim 9, wherein the bottom die is attached to the base carrier with a first adhesive material layer.

11. The stacked multichip package of 10, wherein the bead comprises epoxy.

12. The stacked multichip package of claim 11, wherein the adhesive material comprises epoxy.

13. The stacked multichip package of claim 10, wherein the predetermined spacing between the top die and the bottom die maintained by the bead is sufficient to protect the electrical connections between the first wires and the first bonding pads from being damaged by the attachment of the top die to the bottom die.

14. A stacked multichip package, comprising:

a base carrier having a top side and a bottom side, the top side including a plurality of first leads and a plurality of second leads;

a bottom integrated circuit die having a bottom surface attached to the base carrier top side with a first adhesive material layer, and an opposing, top surface, the top surface having a peripheral area including a plurality of first bonding pads and a central area, wherein the bottom die is electrically connected to the base carrier with first wires, the first wires having first ends electrically connected to the first bonding pads and second ends electrically connected to the first leads;

a bead formed on the top surface of the bottom die between the peripheral area and the central area, wherein the bead does not extend to the first bonding pads;

an adhesive material formed in the central area on the top surface of the bottom die, the adhesive material being surrounded by the bead;

a top integrated circuit die having a bottom surface, wherein the top die is positioned over the bottom die and the bottom surface of the top die is attached to the top surface of the bottom die via the bead and the adhesive material, and the bead maintains a predetermined spacing between the bottom die and the top die, and wherein the top die includes a plurality of second bonding pads located in a peripheral area on a top surface thereof and wherein the top die is electrically connected to the base carrier with second wires, the second wires having first ends electrically connected to the second bonding pads and second ends electrically connected to the second leads, wherein the top die is larger than the bottom die; and an encapsulant covering the first and second dies, the first and second wires, and at least a portion of the top side of the base carrier.

* * * * *